(12) United States Patent
Kharrati et al.

(10) Patent No.: US 8,542,005 B2
(45) Date of Patent: Sep. 24, 2013

(54) CONNECTING DIGITAL STORAGE OSCILLOSCOPES

(75) Inventors: Hamid Kharrati, La Jolla, CA (US); Steven D. Roach, Colorado Springs, CO (US); Joseph Sascha Willis, San Marcos, CA (US)

(73) Assignee: Teradyne, Inc., North Reading, MA (US)

( * ) Notice: Subject to any disclaimer, the term of this patent is extended or adjusted under 35 U.S.C. 154(b) by 528 days.

(21) Appl. No.: 12/769,065

(22) Filed: Apr. 28, 2010

(65) Prior Publication Data

US 2011/0267036 A1   Nov. 3, 2011

(51) Int. Cl.
*G01R 13/34* (2006.01)
*G01R 23/16* (2006.01)
*G01R 21/00* (2006.01)

(52) U.S. Cl.
USPC ............... 324/121 R; 324/76.12; 702/125

(58) Field of Classification Search
USPC ............ 324/76.12–76.38, 121 R, 762.01; 702/66–78, 121–126
See application file for complete search history.

(56) References Cited

U.S. PATENT DOCUMENTS

| | | | |
|---|---|---|---|
| 2,778,883 A | 1/1957 | Buckerfield | |
| 3,573,644 A | 4/1971 | Evel | |
| 3,927,374 A | 12/1975 | Nakaya | |
| 4,097,798 A | 6/1978 | Olson et al. | |
| 4,119,910 A | 10/1978 | Hayashi | |
| 4,147,988 A | 4/1979 | Hall | |
| 4,283,713 A | 8/1981 | Philipp | |
| 4,360,747 A | 11/1982 | Ryan | |
| 4,365,193 A | 12/1982 | Bollero et al. | |
| 4,495,586 A | 1/1985 | Andrews | |
| 4,507,618 A | 3/1985 | Nelson | |
| 4,523,161 A | 6/1985 | Miles | |
| 4,628,253 A | 12/1986 | Yu et al. | |
| 4,647,862 A | 3/1987 | Blair | |

(Continued)

FOREIGN PATENT DOCUMENTS

| | | |
|---|---|---|
| AT | 264510 | 4/2004 |
| AU | 200027578 | 4/2001 |

(Continued)

OTHER PUBLICATIONS

Roach, Steven D., "Signal Conditioning in Oscilloscopes and the Spirit of Invention", in The Art and Science of Analog Circuit Design, ed. Jim Williams, Butterworth-Heinemann, Boston (1995).

(Continued)

*Primary Examiner* — Joshua Benitez Rosario
(74) *Attorney, Agent, or Firm* — Fish & Richardson P.C.

(57) ABSTRACT

An apparatus includes a first oscilloscope having multiple channels, and a second oscilloscope having multiple channels. The first oscilloscope is configured to operate as a master or as a slave. The first oscilloscope operates as the master by using a first trigger signal and a first clock signal that are native to the first oscilloscope, and the first oscilloscope operates as the slave by using a second trigger signal and a second clock signal that are native to the second oscilloscope. The second oscilloscope is configured to operate as the master or as the slave. The second oscilloscope operates as the master by using the second trigger signal and the second clock signal, and the second oscilloscope operates as the slave by using the first trigger signal and the first clock signal.

8 Claims, 3 Drawing Sheets

(56) References Cited

U.S. PATENT DOCUMENTS

| | | |
|---|---|---|
| 4,647,915 A | 3/1987 | Shank et al. |
| 4,678,345 A | 7/1987 | Agoston |
| 4,694,244 A | 9/1987 | Whiteside et al. |
| 4,704,036 A | 11/1987 | Holte et al. |
| 4,716,345 A | 12/1987 | Shank et al. |
| 4,755,951 A | 7/1988 | Hollister |
| 4,779,045 A | 10/1988 | Shank |
| 4,855,968 A | 8/1989 | Shank |
| 5,034,698 A | 7/1991 | Moriyasu |
| 5,097,147 A | 3/1992 | Stuebing et al. |
| 5,119,404 A | 6/1992 | Aihara |
| 5,121,075 A | 6/1992 | Roach |
| 5,180,932 A | 1/1993 | Bengel |
| 5,222,028 A | 6/1993 | LaBarre et al. |
| 5,223,784 A | 6/1993 | Nelson et al. |
| 5,225,776 A | 7/1993 | Dobos et al. |
| 5,289,500 A | 2/1994 | Inou et al. |
| 5,315,627 A | 5/1994 | Draving |
| 5,319,266 A | 6/1994 | Chu et al. |
| 5,498,985 A | 3/1996 | Parle et al. |
| 5,706,222 A | 1/1998 | Bonaccio et al. |
| 5,754,827 A | 5/1998 | Barbier et al. |
| 5,777,489 A | 7/1998 | Barbier et al. |
| 5,912,593 A | 6/1999 | Susak et al. |
| 5,933,129 A | 8/1999 | Egami et al. |
| 6,057,706 A | 5/2000 | Barbier et al. |
| 6,218,904 B1 | 4/2001 | Panther |
| 6,265,894 B1 | 7/2001 | Reblewski et al. |
| 6,366,154 B2 | 4/2002 | Pulvirenti |
| 6,377,106 B1 | 4/2002 | Rozsypal |
| 6,388,465 B1 | 5/2002 | Barbier et al. |
| 6,400,219 B1 | 6/2002 | Fayed |
| 6,473,701 B1 | 10/2002 | Tallman et al. |
| 6,522,083 B1 | 2/2003 | Roach |
| 6,560,494 B1 | 5/2003 | Soto et al. |
| 6,621,913 B1 | 9/2003 | de Vries |
| 6,681,354 B2 | 1/2004 | Gupta |
| 6,701,280 B2 | 3/2004 | Horne et al. |
| 6,717,433 B2 | 4/2004 | Barbier et al. |
| 6,782,298 B2 | 8/2004 | Soto et al. |
| 6,801,097 B2 | 10/2004 | Wallace |
| 6,807,496 B2 | 10/2004 | Pickerd |
| 6,812,688 B2 | 11/2004 | Tan et al. |
| 6,819,170 B1 | 11/2004 | Kindt |
| 6,832,174 B2 | 12/2004 | Tran et al. |
| 6,909,979 B2 | 6/2005 | Saitou et al. |
| 6,927,608 B1 | 8/2005 | Chen et al. |
| 7,058,548 B2 | 6/2006 | Pupalaikis et al. |
| 7,065,458 B2 | 6/2006 | Tran et al. |
| 7,072,804 B2 | 7/2006 | Weller |
| 7,139,684 B2 | 11/2006 | Pupalaikis et al. |
| 7,148,754 B2 | 12/2006 | Kaminski |
| 7,191,079 B2 | 3/2007 | Smith et al. |
| 7,191,372 B1 | 3/2007 | Jacobson et al. |
| 7,219,037 B2 | 5/2007 | Pupalaikis et al. |
| 7,222,055 B2 | 5/2007 | Pupalaikis et al. |
| 7,236,900 B2 | 6/2007 | Hagen et al. |
| 7,245,163 B2 | 7/2007 | Nakamura |
| 7,262,632 B2 | 8/2007 | Hazucha et al. |
| 7,280,930 B2 | 10/2007 | Kobayashi |
| 7,282,965 B2 | 10/2007 | Hatooka et al. |
| 7,285,946 B2 | 10/2007 | Ems et al. |
| 7,304,550 B2 | 12/2007 | Rostami et al. |
| 7,365,617 B2 | 4/2008 | Rostami et al. |
| 7,373,281 B2 | 5/2008 | Pupalaikis et al. |
| 7,386,409 B2 | 6/2008 | Mueller et al. |
| 7,394,410 B1 | 7/2008 | Wegener |
| 7,519,513 B2 | 4/2009 | Pupalaikis et al. |
| 7,616,066 B2 | 11/2009 | Ishii et al. |
| 7,642,822 B2 | 1/2010 | Baker et al. |
| 7,646,766 B2 | 1/2010 | Schmidt et al. |
| 7,868,664 B2 | 1/2011 | Markozen et al. |
| 7,881,414 B2 | 2/2011 | Kimura et al. |
| 7,944,229 B2 * | 5/2011 | Joshi et al. ............... 324/762.01 |
| 8,073,656 B2 * | 12/2011 | Pupalaikis et al. ........... 702/189 |
| 8,239,158 B2 * | 8/2012 | Crain et al. ................. 702/123 |
| 8,305,903 B1 | 11/2012 | Louise et al. |
| 8,386,208 B2 | 2/2013 | Cake et al. |
| 8,433,532 B2 * | 4/2013 | LeBrun et al. ................. 702/67 |
| 8,433,543 B2 * | 4/2013 | LeBrun et al. ............... 702/189 |
| 2002/0089349 A1 | 7/2002 | Barbier et al. |
| 2002/0104051 A1 | 8/2002 | Gupta |
| 2002/0175732 A1 | 11/2002 | Blon et al. |
| 2002/0175739 A1 | 11/2002 | Sidiropoulos et al. |
| 2002/0196013 A1 | 12/2002 | Goldstein et al. |
| 2003/0090299 A1 | 5/2003 | Dathe et al. |
| 2003/0184349 A1 | 10/2003 | Carvajal et al. |
| 2003/0208330 A1 | 11/2003 | Pickerd |
| 2003/0223317 A1 | 12/2003 | Soto et al. |
| 2004/0012454 A1 | 1/2004 | Wallace |
| 2004/0117138 A1 | 6/2004 | Tran et al. |
| 2004/0117143 A1 | 6/2004 | Tran et al. |
| 2004/0128076 A1 | 7/2004 | Pupalaikis et al. |
| 2004/0178820 A1 | 9/2004 | Barbier et al. |
| 2005/0089883 A1 | 4/2005 | Weinrich et al. |
| 2005/0134324 A1 | 6/2005 | Boyer et al. |
| 2005/0174148 A1 | 8/2005 | Fiedler |
| 2005/0225310 A1 | 10/2005 | Smith et al. |
| 2005/0234670 A1 | 10/2005 | Hagen et al. |
| 2005/0261853 A1 | 11/2005 | Dobyns |
| 2006/0074606 A1 | 4/2006 | Pupalaikis et al. |
| 2006/0080065 A1 | 4/2006 | Pupalaikis et al. |
| 2006/0106502 A1 | 5/2006 | See et al. |
| 2006/0145768 A1 | 7/2006 | Kaminski |
| 2006/0161401 A1 | 7/2006 | Pupalaikis et al. |
| 2006/0176151 A1 | 8/2006 | Ems et al. |
| 2006/0177018 A1 | 8/2006 | Kobayashi et al. |
| 2006/0178850 A1 | 8/2006 | Kobayashi |
| 2006/0195301 A1 | 8/2006 | Mueller et al. |
| 2006/0202748 A1 | 9/2006 | Furukawa et al. |
| 2006/0238270 A1 | 10/2006 | Rostami et al. |
| 2006/0244494 A1 | 11/2006 | Cetrulo et al. |
| 2006/0259256 A1 | 11/2006 | Roach |
| 2007/0013449 A1 | 1/2007 | Ishii et al. |
| 2007/0027658 A1 | 2/2007 | Pupalaikis et al. |
| 2007/0069768 A1 | 3/2007 | Hatooka et al. |
| 2007/0112532 A1 | 5/2007 | Pupalaikis et al. |
| 2007/0126525 A1 | 6/2007 | Nicholson |
| 2007/0185669 A1 | 8/2007 | Pupalaikis et al. |
| 2007/0247256 A1 | 10/2007 | Rostami et al. |
| 2008/0054967 A1 | 3/2008 | Kobayashi |
| 2008/0061844 A1 | 3/2008 | Zeng et al. |
| 2008/0120053 A1 | 5/2008 | Pupalaikis et al. |
| 2008/0130654 A1 | 6/2008 | Schmidt et al. |
| 2008/0258957 A1 | 10/2008 | Pupalaikis et al. |
| 2008/0309355 A1 | 12/2008 | Nozaki et al. |
| 2009/0002213 A1 | 1/2009 | LaMarche et al. |
| 2009/0027086 A1 | 1/2009 | Trifonov |
| 2009/0066403 A1 | 3/2009 | Horsky et al. |
| 2009/0108906 A1 | 4/2009 | Butler |
| 2009/0251186 A1 | 10/2009 | Nedachi |
| 2009/0267666 A1 | 10/2009 | Marutani |
| 2010/0039157 A1 | 2/2010 | Kaeriyama et al. |
| 2010/0102868 A1 | 4/2010 | Kim et al. |
| 2010/0117699 A1 | 5/2010 | Wu et al. |
| 2010/0176847 A1 | 7/2010 | Kitsunezuka et al. |
| 2010/0182050 A1 | 7/2010 | Markozen et al. |
| 2011/0043270 A1 | 2/2011 | Kusuda |
| 2011/0115526 A1 | 5/2011 | Ouchi |
| 2011/0187424 A1 | 8/2011 | Grewing et al. |
| 2011/0191066 A1 | 8/2011 | Delbue et al. |
| 2011/0267030 A1 | 11/2011 | Roach |
| 2011/0267036 A1 | 11/2011 | Kharrati et al. |
| 2011/0267037 A1 * | 11/2011 | Kharrati et al. ............ 324/121 R |
| 2011/0267214 A1 | 11/2011 | Roach |
| 2012/0212251 A1 | 8/2012 | Yanagishima et al. |

FOREIGN PATENT DOCUMENTS

| | | |
|---|---|---|
| AU | 2003252059 | 2/2004 |
| AU | 2003291653 | 5/2004 |
| CA | 1126866 | 6/1982 |
| CA | 1203295 | 4/1986 |
| CA | 1278344 | 12/1990 |
| CA | 2238955 | 11/1999 |

| | | |
|---|---:|---:|
| CA | 2272740 | 11/1999 |
| CA | 2353950 | 4/2001 |
| CN | 1399724 | 2/2003 |
| CN | 1675822 | 9/2005 |
| CN | 1723621 | 1/2006 |
| CN | 101116066 | 1/2008 |
| DE | 2824103 | 12/1978 |
| DE | 3065612 | 12/1983 |
| DE | 3335868 | 4/1984 |
| DE | 60009856 | 5/2004 |
| DE | 102004019966 | 11/2005 |
| DE | 102006040793 | 6/2007 |
| EP | 0023708 | 2/1981 |
| EP | 0250682 | 1/1988 |
| EP | 0278637 | 8/1998 |
| EP | 1133702 | 9/2001 |
| EP | 1359427 | 11/2003 |
| EP | 1554807 | 7/2005 |
| EP | 1738185 | 1/2007 |
| EP | 1836586 | 9/2007 |
| EP | 1846770 | 10/2007 |
| EP | 1847103 | 10/2007 |
| FR | 2393472 | 12/1978 |
| FR | 2534090 | 4/1984 |
| GB | 1583550 | 1/1981 |
| GB | 2130038 | 5/1984 |
| GB | 2433659 | 6/2007 |
| IT | 1119341 | 3/1986 |
| JP | 54-002019 | 1/1979 |
| JP | 59-086322 | 5/1984 |
| JP | 63-5270 | 1/1988 |
| JP | 63-193068 | 8/1988 |
| JP | 02-007609 | 1/1990 |
| JP | 02-052282 | 2/1990 |
| JP | 03-211695 | 9/1991 |
| JP | 04-212067 | 8/1992 |
| JP | 06-034666 | 2/1994 |
| JP | 09-318669 | 12/1997 |
| JP | 2002-544576 | 12/2002 |
| JP | 2003-329709 | 11/2003 |
| JP | 2006-504100 | 2/2006 |
| JP | 2007-159118 | 6/2007 |
| JP | 2008-521014 | 6/2008 |
| MX | PA05000704 | 4/2005 |
| NL | 7806065 | 12/1978 |
| NL | 8303383 | 5/1984 |
| NL | 8901648 | 1/1990 |
| NL | 187880 | 9/1991 |
| TW | 339409 | 9/1998 |
| WO | WO01/23901 | 4/2001 |
| WO | WO2004/010571 | 1/2004 |
| WO | WO2004/038432 | 5/2004 |
| WO | WO2005/103736 | 11/2005 |
| WO | WO2006/055935 | 5/2006 |
| WO | WO2006/086256 | 8/2006 |
| WO | WO2006/086257 | 8/2006 |
| WO | WO2006/086258 | 8/2006 |
| WO | WO2006/093541 | 9/2006 |

OTHER PUBLICATIONS

White Paper "XYZs of Oscilloscopes: Primer", TEK1511 / 03W-8605-5, (c) 2009 Tektronix.

Agilent Technologies Application Note 1608, "What is the difference between an equivalent time sampling oscilloscope and a real-time oscilloscope?", 5989-8794EN, (c) 2008 Agilent Technologies, Inc.

Search Report for U.S. Appl. No. 12/769,065, entitled "Fixed-Price Novelty Search Report (Your Ref: 2196; Our Ref: 1001002/DB)" (2010).

Search Report for U.S. Appl. No. 12/769,082, entitled "Fixed-Price Novelty Search Report (Your Ref: 2195; Our Ref: 1001003/DB/sp)" (2010).

Search Report for U.S. Appl. No. 12/769,114, entitled "Fixed-Price Novelty Search Report (Your Ref: 2197; Our Ref: 1001001/DB)" (2010).

Search Report for U.S. Appl. No. 12/769,075, entitled "Fixed-Price Novelty Search Report (Your Ref: 2198; Our Ref: 1001004/DB)" (2010).

Action and Response History in US Publication No. US2004/0117138.

Teradyne, Inc., "Prior Art Fig. 1: Ai760 DSO Rev A showing differential drive comparators with trigger level control . . . ", (Aug. 2007).

Teradyne, Inc., "Prior Art Fig. 1: Ai760 Rev A DSO and prior art references listed in Section 7", (Aug. 2007).

* cited by examiner

CONNECTING DIGITAL STORAGE OSCILLOSCOPES

CROSS-REFERENCE TO RELATED APPLICATIONS

The following patent applications, all of which were filed on the same day, are related: (1) U.S. patent application Ser. No. 12/769,082, entitled "Driving An Electronic Instrument", (2) U.S. patent application Ser. No. 12/769,114, now U.S. Pat. No. 8,098,181, entitled "Attenuator Circuit", and (3) U.S. patent application Ser. No. 12/769,075, entitled "Multi-Level Triggering Circuit", The disclosure of each of these patent applications is hereby incorporated by reference into this patent application as if set forth herein in full.

TECHNICAL FIELD

This patent application relates generally to connecting digital storage oscilloscopes.

BACKGROUND

An oscilloscope is an instrument for graphically displaying measured electrical parameters, such as voltage. Typically, an oscilloscope's graphical display includes a two-dimensional plot of the electrical parameter versus time.

Originally, oscilloscopes were analog devices, which displayed their graphics on a cathode ray tube (CRT). Newer types of oscilloscopes are digital. For example, a digital storage oscilloscope (DSO) can convert analog signals to digital form, store those signals, and process the signals for display, typically on a liquid crystal display (LCD) device.

DSOs having two channels are known. One type of DSO is capable of receiving two input analog signals (one per channel), digitizing those signals, relating those signals to a single internally-detected trigger event, and displaying a resulting graphical image.

An asynchronous trigger signal may be generated in response to a trigger event in one two-channel DSO. It is known to provide that asynchronous trigger signal to another two-channel DSO in an attempt to relate more than two signals to that same trigger event.

SUMMARY

This patent application describes connecting electronic instruments, such as digital storage oscilloscopes (DSO).

This patent application describes an apparatus comprising a first oscilloscope having multiple channels, and a second oscilloscope having multiple channels, the first and second oscilloscopes comprising digital storage oscilloscopes. The first oscilloscope is configured to operate as a master or as a slave. The first oscilloscope operates as the master by using a first trigger signal and a first clock signal that are native to the first oscilloscope, and the first oscilloscope operates as the slave by using a second trigger signal and a second clock signal that are native to the second oscilloscope. The second oscilloscope is configured to operate as the master or as the slave. The second oscilloscope operates as the master by using the second trigger signal and the second clock signal, and the second oscilloscope operates as the slave by using the first trigger signal and the first clock signal. This apparatus may include one or more of the following features, alone or in combination.

When the first oscilloscope is configured to operate as the master, the second oscilloscope may be configured to operate as the slave, and when the second oscilloscope is configured to operate as the master, the first oscilloscope may be configured to operate as the slave. Each of the first and second oscilloscopes may comprise circuitry to select either the first clock signal or the second clock signal, and circuitry to select either first trigger signal or the second trigger signal. Each of the first and second oscilloscopes may comprise an analog to digital converter (ADC) to receive either the first clock signal or the second clock signal, the ADC to convert an input analog signal into a digital signal, and circuitry to generate a trigger signal, the trigger signal being either the first trigger signal or the second trigger signal. The circuitry may comprise a comparator to identify when the input analog signal exceeds a voltage, an edge selector to identify a rising or falling edge of a signal output by the comparator and to produce an asynchronous trigger signal, and a latch to output the trigger signal based on the asynchronous trigger signal and a version of a clock signal, the clock signal being either the first clock signal or the second clock signal. The circuitry of each of the first and second oscilloscopes may comprise a step-down circuit to generate the version of the clock signal, where the step down circuit is configured to generate the version of the clock signal by sampling the clock signal. The trigger signal may be a synchronous trigger signal because the trigger signal output by the latch is synchronized to the version of the clock signal. Each of the first and second oscilloscopes may further comprise a time interval digitizer to determine a time difference that is based on the asynchronous trigger signal and the synchronous trigger signal. The time difference may be a difference between an actual time that a trigger event occurred and a time that a clock signal running the ADC occurred. Each of the first and second oscilloscopes may comprise memory and a controller to capture data from the ADC based on the time difference, and to store the data in the memory. The first oscilloscope may comprise a digital storage oscilloscope and the second oscilloscope may comprise a digital storage oscilloscope. Either of the first and second oscilloscopes may take on the role of master or slave.

This patent application also describes an apparatus comprising multi-channel digital storage oscilloscopes interconnected via circuitry so that the multi-channel digital storage oscilloscopes share a common clock signal and a common trigger signal. This apparatus may include one or more of the following features, alone or in combination.

The circuitry may comprise a connection between individual multi-channel digital storage oscilloscopes, and selection circuits in each of the multi-channel digital storage oscilloscopes. The selection circuits in a subject multi-channel digital storage oscilloscope may be for selecting either (i) an internal clock signal and an internal trigger signal that were generated for the subject multi-channel digital storage oscilloscope, or (ii) an external clock signal and an external trigger signal that were generated for another multi-channel digital storage oscilloscope that is not the subject multi-channel digital storage oscilloscope. The multi-channel digital storage oscilloscopes may comprise more than two interconnected multi-channel digital storage oscilloscopes. Each of the multi-channel digital storage oscilloscopes may be configurable to act as a master or a slave, where master is configured to provide the common clock signal and the common trigger signal, and the slave is configured to accept the common clock signal and the common trigger signal from the master.

This patent application also describes a first multi-channel digital storage oscilloscope comprising a connection circuit to receive an external clock signal and an external trigger signal from a second multi-channel digital storage oscilloscope, selection circuitry to select the external clock signal and the external trigger signal over internally-generated clock and trigger signals, an analog to digital converter (ADC) to receive the external clock signal, and to convert an input analog signal into a digital signal using the external clock signal, and a controller to use the external trigger signal to capture data from the digital signal and to store the data. This apparatus may include one or more of the following features, alone or in combination.

The second multi-channel digital storage oscilloscope may be substantially identical to the first multi-channel digital storage oscilloscope. The first multi-channel digital storage oscilloscope may further comprise a second ADC to receive the external clock signal, and to convert a second input analog signal into a second digital signal using the external clock signal, and the controller may be configured to use the external trigger signal to capture data from the second digital signal and to store the data from the second digital signal. The connection circuit may comprise circuit paths between the first multi-channel digital storage oscilloscope and the second multi-channel digital storage oscilloscope. The first multi-channel digital storage oscilloscope and the second multi-channel digital storage oscilloscope may be identical.

Any two or more of the features described in this summary section may be combined to form embodiments not specifically described in this patent application.

All or part of the foregoing may be implemented as a computer program product comprised of instructions that are stored on one or more machine-readable media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DETAILED DESCRIPTION

Described herein is way of connecting two or more multi-channel digital storage oscilloscopes (DSOs). Specifically, two or more independent DSOs may be combined to multiply their channel count. The resulting combination substantially maintains timing accuracy among measurements on all channels of the DSOs, thereby mimicking one unified instrument. Trigger timing errors may be reduced or eliminated by transmitting a clock signal and a clock-synchronous (or simply, "synchronous") trigger signal among the DSOs, as described below. The DSO generating the clock and synchronous trigger signals, referred to as the master, provides the clock and synchronous trigger signals to the other DSO(s), \referred to as the slave(s). In one example, the two or more DSOs are completely symmetric in their roles (master or slave). There is no fixed master or fixed slave. Thus, the two or more DSOs may change roles as needed.

Figure 1:
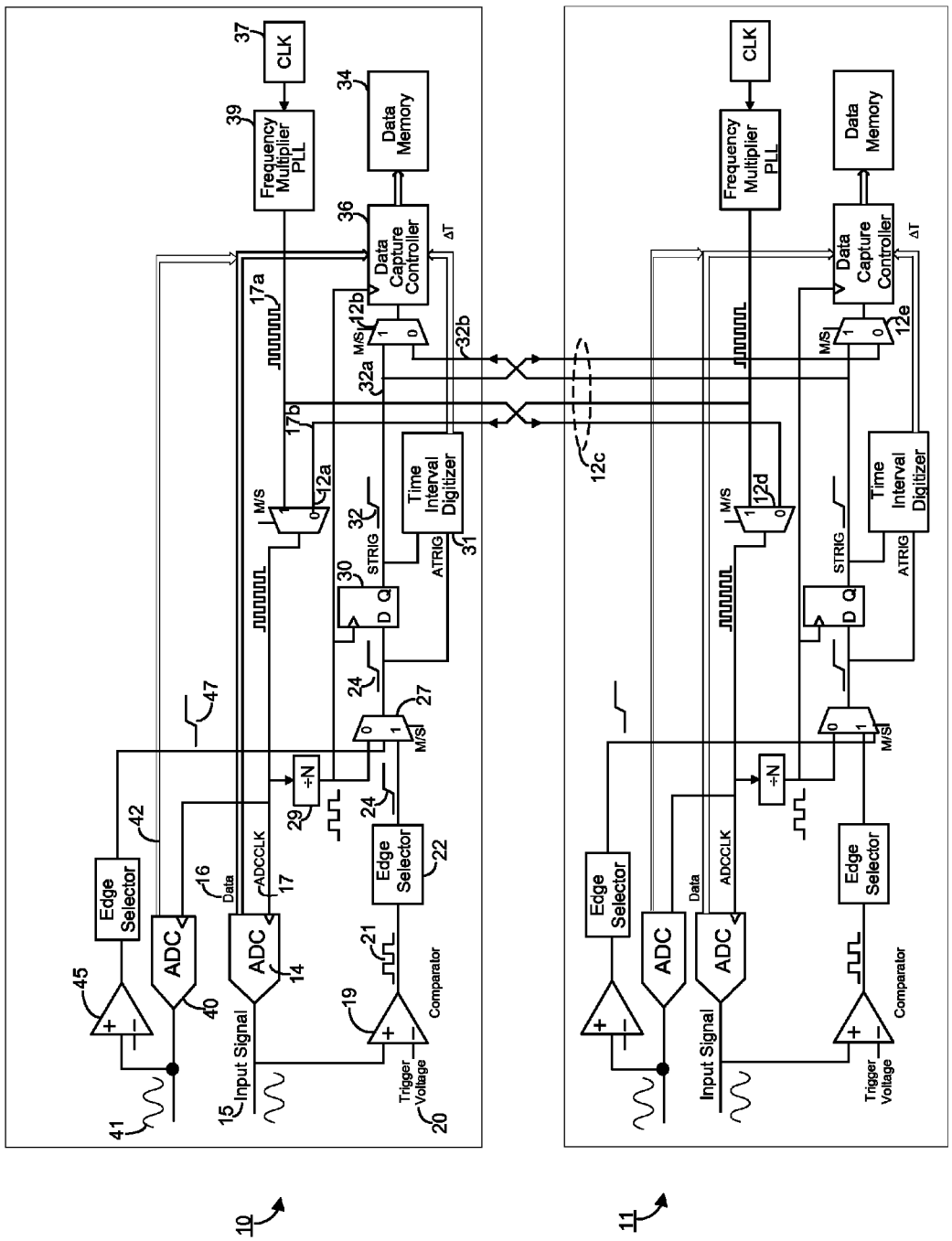
FIG. 1 is a block diagram of two DSOs that are interconnected in a master/slave configuration that shares clock and trigger signals.

FIG. 1 shows an example of two DSOs 10 and 11 that are interconnected, via circuitry 12a-12e, to enable the DSOs share a common clock signal and a common synchronous trigger signal. In this example, DSOs 10 and 11 are substantially similar or identical in function and/or construction. However, DSOs that are not substantially similar or identical may also be interconnected as described herein.

DSO 10 is described in detail, leaving out an explanation of interconnection circuitry 12a-12e, which is described below. Corresponding components of DSO 11 are substantially similar or identical to those described for DSO 10. In this context, substantially similar means at least that the components have the same, or close to the same, function, and that about the same types of circuits are used to implement those components. Different parts, sub-parts, or structures may be used in substantially similar circuits.

DSO 10 includes an analog-to-digital converter (ADC) 14 for receiving an input analog signal 15 and for converting that analog signal to a digital signal 16 (i.e., digital data) in accordance with a clock signal 17 (ADDCLK). In this example, clock signal 17 is typically on the order of two gigahertz (2 GHz); however, any frequency may be used. The input analog signal 15 is the signal that the DSO will eventually reconstitute for display.

DSO 10 also includes a comparator 19 to identify when input analog signal 15 exceeds a predefined voltage threshold. This is referred to as the threshold event, and is the point from which input analog signal 15 is referenced. Comparator 19 receives input analog signal 15 at its positive input and the voltage threshold 20 (trigger voltage) at its negative input. When input analog signal 15 exceeds voltage threshold 20, comparator 19 outputs a signal 21. Any type of signal may be used to indicate the trigger event.

Figure 2:
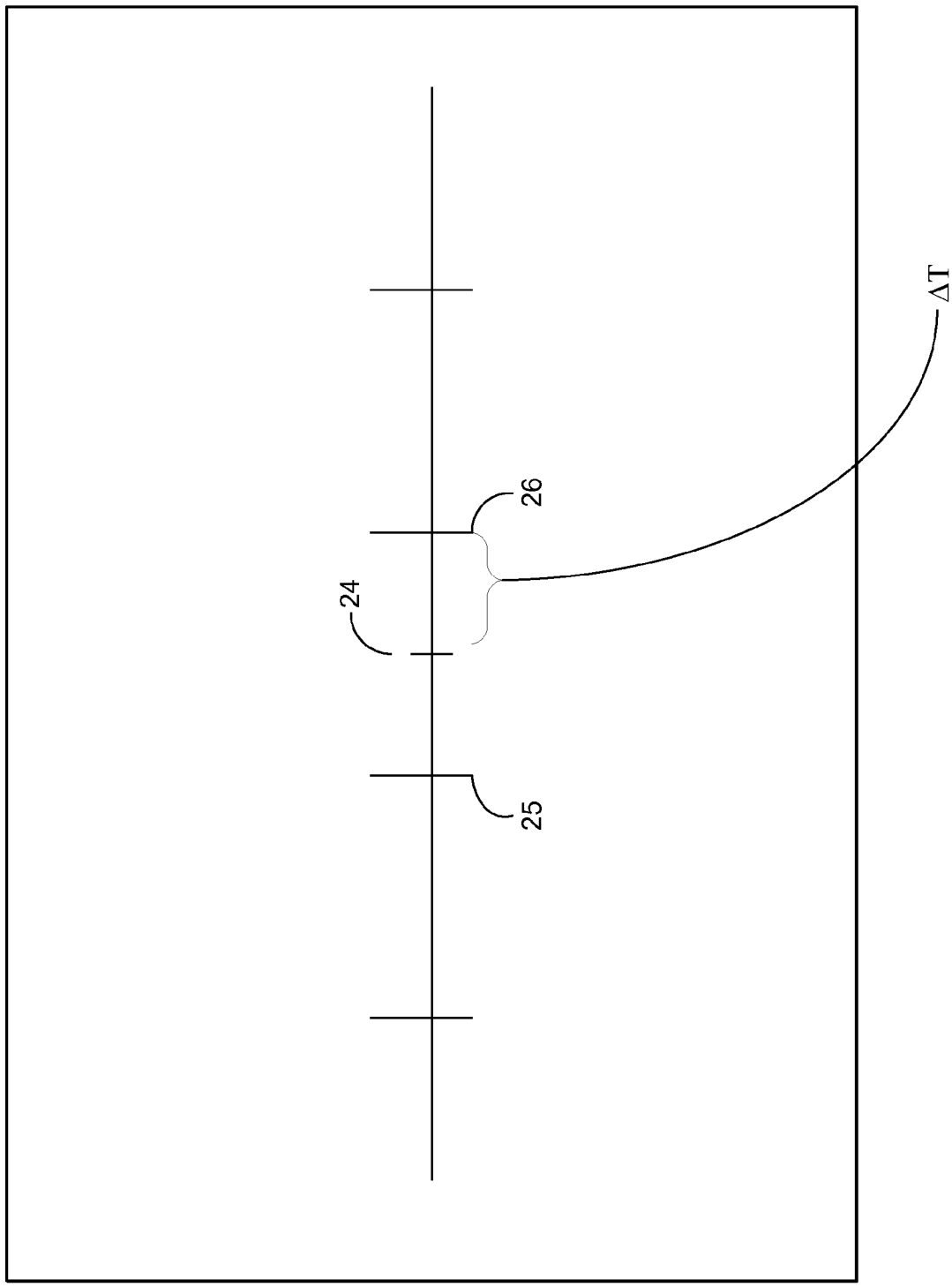
FIG. 2 is a plot showing a detected asynchronous trigger signal relative to pulses of a clock signal used to sample an input analog signal.

Edge selector 22 is a circuit that identifies either a rising edge or a falling edge of signal 21 output by comparator 19. The output of edge selector 22 constitutes an asynchronous trigger signal 24. Signal 24 is asynchronous because it is not in phase with clock signal 17. Rather, since signal 24 was detected in "real-time", it will likely fall in between two pulses 25, 26 of clock signal 17, as shown in FIG. 2.

Selector circuit 27 can be a flip-flop or other circuitry that is used to select, for output, either an asynchronous trigger signal (e.g., 24) or a version of clock signal 17. A step-down circuit 29 may be used to produce the version of clock signal 17. For example, step-down circuit 29 may reduce the frequency of clock signal 17. A purpose of the step-down circuit (divide-by-N block) is to reduce the clock rate to something more easily handled by the time interval digitizer and the circuitry that controls acquisition and data storage. The sample rate is reduced inside the data capture controller, and it is user programmable. Thus, the step-down circuit reduces the clock rate for practical signal handling purposes and does not change the functionality of the system. The user may set program the step-down circuit via a computer or other instrument controls communicatively coupled to DSO 10.

Assuming that selector circuit 27 selects asynchronous trigger signal 24, selector circuit 27 outputs asynchronous trigger signal 24 (ATRIG) to both a latch circuit 30 and a time interval digitizer 31. Latch circuit 30 receives asynchronous trigger signal 24 and, in accordance with clock signal 17 (the full or stepped-down version), outputs a synchronous trigger signal 32 (STRIG). Synchronous trigger signal 32 is synchronous because it is in phase with clock signal 17, unlike asynchronous trigger signal 24, which is likely not in phase with clock signal 17. In this regard, it is noted that, in some cases, synchronous trigger signal 32 and asynchronous trigger signal 24 may both be in phase with clock signal 17. These cases, however, are coincidental, and not necessarily intended.

Time interval digitizer 31 is a circuit and/or controller that determines the real-time difference (ΔT, also referred to as "initial X") between the asynchronous trigger signal 24 and the clock signal 17. The phase of clock signal 17 is represented, in time interval digitizer 31, by synchronous trigger signal 32, since synchronous trigger signal 32 is in phase with clock signal 17. Referring to FIG. 2, this difference is labeled ΔT. This difference, ΔT, is used by a microprocessor or other processing device (not shown) to reconstruct original analog signal 15 using digital data stored in data memory 34 for display on the DSO, and to relate original analog signal 15 to the detected trigger event.

DSO 10 also includes a data capture controller 36, which may be any type of microcontroller or other processing circuitry. Data capture controller 36 receives (e.g., "captures") data from ADC 14 in accordance with clock signal 17 (the full or stepped-down version). Data capture controller 36 stores this data, along with synchronous trigger signal 32 and ΔT in data memory 34. As noted above, a microprocessor or other processing device uses this information to reconstruct the original analog signal for display on the DSO.

Clock signal 17 may be generated by a device 37, such as an oscillator. A frequency multiplier phase-locked loop circuit 39, or other circuitry, may optionally be used to increase the frequency of the clock.

DSO 10 is two-channel, meaning that two separate input analog signals can be tracked relative to the same internal trigger signal. So, in FIG. 1, DSO 10 contains a second ADC 40 for receiving a second input analog signal 41. The second ADC 41 receives clock signal 17, and produces a second digital signal 42. Second digital signal 42, is provided to, and stored via, data capture controller 36 in the manner described above. DSO 10 also includes a second comparator 45 and a second edge selector circuit 46 for generating a second asynchronous trigger signal 47. These components may have the same structure and function as their counterparts described above. Selector circuit 27 selects either the first asynchronous trigger signal 24 or the second asynchronous trigger signal 47 for subsequent processing to determine ΔT. The selected asynchronous trigger signal is processed by the downstream DSO circuitry in the manner described above.

As noted above, one advantage of the foregoing b configuration is that two separate input analog signals can be tracked relative to the same trigger event. A microprocessor or other processing device may use this information for subsequent signal processing, including comparisons involving the input analog signals.

Figure 3:
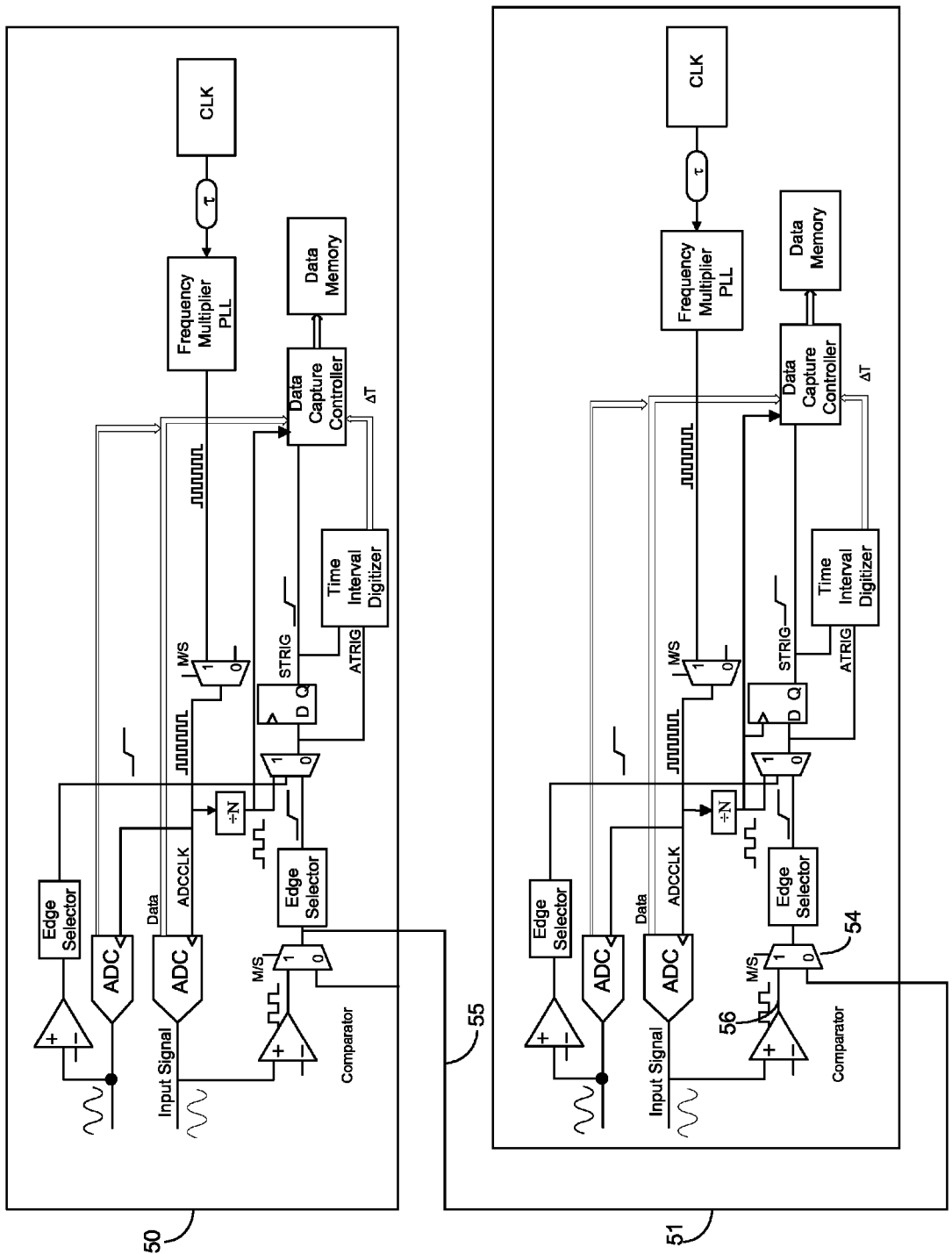
FIG. 3 is a block diagram of a prior art interconnection of two DSOs.

FIG. 3 shows a known way of interconnecting two DSOs. In this example, DSOs of the type shown in FIG. 2 are interconnected using a prior art technique. It is noted that the interconnection circuitry constitutes prior art, not necessarily the architecture of the individual DSOs. As shown in the prior art connection of FIG. 3, the asynchronous trigger signal 55 of one DSO 50 may be provided to a second DSO 51. The circuitry shown in FIG. 3 operates in the manner described above, except for the following. The second DSO 51 may select, using selector circuit 54, either the trigger signal 55 from the first DSO (from which its asynchronous trigger signal is generated) or its native, internally-generated trigger signal 56 (from which its asynchronous trigger signal is generated) for processing to determine ΔT. This configuration has disadvantages in that the second DSO 51 adds its triggering errors, which may be caused by, e.g., jitter and temperature differences, to those of the first DSO 50, resulting in errors in ΔT.

The interconnection shown in FIG. 1 is less error prone than that of FIG. 3. In the configuration of FIG. 1, one DSO is configured, through the use of interconnection circuitry 12a-12e, to operate as either master or a slave of the other DSO. The slave DSO uses the clock signal and the synchronous trigger signal of the master DSO. Thus, both DSOs share a common clock signal and a common synchronous trigger signal. For example, the first DSO can operate as the master by using a synchronous trigger signal and a clock signal that are native to (e.g., generated internal to, or generated for) the first DSO. The first DSO can operate as the slave by using a synchronous trigger signal and a clock signal that are native to the second DSO. In this case, the first DSO uses a synchronous trigger signal and a clock signal that are generated external to the first DSO or generated for another DSO. Second DSO 11 is also configured to operate as the master or as the slave. The second DSO can operate as the master by using the synchronous trigger signal and the clock signal that are native to the second DSO. The second DSO can operate as the slave by using the synchronous trigger signal and the clock signal that are native to the first DSO.

Referring to FIG. 1 first DSO 10 and second DSO 12 are connected via a connection circuitry 12a-12e which, in this example, includes multiple circuit paths 12c. These circuit paths may be implemented via separate wires or one or more buses. Each of the DSOs includes circuitry to select either its own clock signal or that of the other DSO, and circuitry to select its own trigger signal or that of the other DSO. For example, DSO 10 includes selector circuit 12a to select its own clock signal 17a or clock signal 17b from DSO 11. DSO 10 also includes selector circuit 12b to select either its own synchronous trigger signal 32a or synchronous trigger signal 32b from DSO 11. The ΔT that corresponds to the selected synchronous trigger signal is provided to data capture controller 36.

DSO 11 contains interconnection and selection circuitry that is identical, at least functionally, to that described above for DSO 10. That way, DSO 11 can select the clock and synchronous trigger signals of DSO 10 or DSO 11, and DSO 10 can select the clock and synchronous trigger signals of DSO 10 or DSO 11. It is noted that when DSO 10 acts as master, DSO 11 acts as slave, and vice versa.

By interconnecting DSOs 10 and 11 in the manner described above, it is possible to track four separate input analog signals relative to the same trigger event. In this example, only two multi-channel DSOs have been interconnected. However, it is possible to connect any number N (N≧2) DSOs in the manner described herein, thereby making it possible to track 2*N input analog signals relative to the same trigger event (where, in this example, the multi-channel DSO has two (2) channels).

To summarize, in the circuitry of FIG. 1, the clock and synchronous trigger signals are delivered from master to slave in a way that reduces errors produced in the prior art system shown in FIG. 3. Rather than sending a signal on which the slave independently triggers, the master sends the ADC sample clock and a synchronous trigger signal that simply tells the slave in which sample period the trigger event occurred (e.g., the input analog signal exceeded the threshold). Jitter on the trigger signal does not significantly contribute to jitter in the slave ADC samples because the trigger signal is synchronous. Therefore, there is little or no jitter or temperature drift added by the slave's triggering system. The master measures the time between the trigger and the ADC samples for both the master and the slave. Even though the master and slave have independent triggering and acquisition control circuits, they behave as if there were one trigger and one control circuit, thereby mimicking an N-channel (e.g., four channel) instrument built on a single printed circuit board.

Thus, the connection mechanism(s) described herein combine two (or more) DSOs to increase their combined channel count. The connection reduces timing errors by sharing both a clock signal and a synchronous trigger signal among DSOs. As explained above, the DSOs are symmetrical in their roles. The DSO generating the synchronous trigger signal, referred to as the master DSO, provides the clock and the synchronous trigger signal to the other DSO, referred to as the slave. The DSOs may switch roles, as desired. A user operating the DSOs may program, e.g., via a computer or other instrument controls communicatively coupled to the DSOs, which DSO is to take on which role. The computer may also generate the selection signals used in the selection circuitry to ensure that each DSO uses the proper clock and synchronous trigger signal, as described herein.

A microprocessor or other processing device or circuitry may use the digital data and ΔT values to reproduce the original analog signals, and relate them to the same triggering event.

Any of the functions described herein and their various modifications (hereinafter "the functions") are not limited to the hardware and software described herein. All or part of the functions can be implemented, at least in part, via a computer program product, e.g., a computer program tangibly embodied in an information carrier, such as one or more machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Components of different embodiments described herein may be combined to form other embodiments not specifically set forth above. Components may be left out of the circuitry shown in FIG. 1 without adversely affecting its operation. Furthermore, various separate components may be combined into one or more individual components to perform the functions described herein.

Any components of the following patent applications may be combined to produce embodiment(s) not specifically described herein: (1) U.S. patent application Ser. No. 12/769,065, entitled "Connecting Digital Storage Oscilloscopes", (2) U.S. patent application Ser. No. 12/769,082, entitled "Driving An Electronic Instrument", (3) U.S. patent application Ser. No. 12/769,114, now U.S. Pat. No. 8,098,181, entitled "Attenuator Circuit", and (4) U.S. patent application Ser. No. 12/769,075, entitled "Multi-Level Triggering Circuit".

Other embodiments not specifically described herein are also within the scope of the following claims.

What is claimed is:

1. An apparatus comprising:
   a first oscilloscope having multiple channels; and
   a second oscilloscope having multiple channels, the first and second oscilloscopes comprising digital storage oscilloscopes;
   wherein the first oscilloscope is configured to operate as a master or as a slave, the first oscilloscope operating as the master by using a first trigger signal and a first clock signal that are native to the first oscilloscope, and the first oscilloscope operating as the slave by using a second trigger signal and a second clock signal that are native to the second oscilloscope; and
   wherein the second oscilloscope is configured to operate as the master or as the slave, the second oscilloscope operating as the master by using the second trigger signal and the second clock signal, and the second oscilloscope operating as the slave by using the first trigger signal and the first clock signal.

2. The apparatus of claim 1, wherein when the first oscilloscope is configured to operate as the master, the second oscilloscope is configured to operate as the slave, and when the second oscilloscope is configured to operate as the master, the first oscilloscope is configured to operate as the slave.

3. The apparatus of claim 2, wherein each of the first and second oscilloscopes comprises:
   circuitry to select either the first clock signal or the second clock signal; and
   circuitry to select either first trigger signal or the second trigger signal.

4. The apparatus of claim 2, wherein each of the first and second oscilloscopes comprises:
   an analog to digital converter (ADC) to receive either the first clock signal or the second clock signal, the ADC to convert an input analog signal into a digital signal; and
   circuitry to generate a trigger signal, the trigger signal being either the first trigger signal or the second trigger signal, the circuitry comprising:
      a comparator to identify when the input analog signal exceeds a voltage;
      an edge selector to identify a rising or falling edge of a signal output by the comparator and to produce an asynchronous trigger signal; and
      a latch to output the trigger signal based on the asynchronous trigger signal and a version of a clock signal, the clock signal being either the first clock signal or the second clock signal.

5. The apparatus of claim 4, wherein the circuitry of each of the first and second oscilloscopes comprises a step-down circuit to generate the version of the clock signal, the step down circuit being configured to generate the version of the clock signal by sampling the clock signal.

6. The apparatus of claim 4, wherein the trigger signal is a synchronous trigger signal because the trigger signal output by the latch is synchronized to the version of the clock signal; and wherein each of the first and second oscilloscopes further comprises:

a time interval digitizer to determine a time difference that is based on the asynchronous trigger signal and the synchronous trigger signal, the time difference being a difference between an actual time that a trigger event occurred and a time that a clock signal running the ADC occurred.

7. The apparatus of claim 6, wherein each of the first and second oscilloscopes further comprises:

memory; and a controller to capture data from the ADC based on the time difference, and to store the data in the memory.

8. The apparatus of claim 1, wherein the first oscilloscope comprises a digital storage oscilloscope and the second oscilloscope comprises a digital storage oscilloscope; and wherein either of the first and second oscilloscopes may take on the role of master or slave.

\* \* \* \* \*